United States Patent [19]

Alles et al.

[11] 4,163,155

[45] Jul. 31, 1979

[54] DEFINING A LOW-DENSITY PATTERN IN A PHOTORESIST WITH AN ELECTRON BEAM EXPOSURE SYSTEM

[75] Inventors: David S. Alles, Covent Station; Alfred U. Mac Rae, Berkeley Heights; Roger F. W. Pease, Holmdel, all of N.J.

[73] Assignee: Bell Telephone Laboratories, Incorporated, Murray Hill, N.J.

[21] Appl. No.: 894,420

[22] Filed: Apr. 7, 1978

[51] Int. Cl.² ............................................. A61K 27/02
[52] U.S. Cl. .............................. 250/492 B; 250/492 A
[58] Field of Search ........................ 250/492 A, 492 B

[56] References Cited

U.S. PATENT DOCUMENTS 3,914,608  10/1975  Malmberg ..................... 250/492 A Primary Examiner—Harold A. Dixon
Attorney, Agent, or Firm—Lucian C. Canepa

[57] ABSTRACT

By modifying the raster scanning mode of operation of an electron beam exposure system, it is practicable to directly define low-density features (100–102) in a relatively insensitive positive photoresist (10) that exhibits high resolution and good processing characteristics. As a result, it is feasible to utilize such a system as an adjunct in what is otherwise a photolithographic fabrication process to define certain critical features of a microminiature device.

5 Claims, 4 Drawing Figures

DEFINING A LOW-DENSITY PATTERN IN A PHOTORESIST WITH AN ELECTRON BEAM EXPOSURE SYSTEM

TECHNICAL FIELD

This invention relates to the fabrication of semiconductor devices and circuits and, more particularly, to a microlithographic process that includes both photobeam and electron beam lithographic steps.

BACKGROUND OF THE INVENTION

It is known to utilize direct electron lithography and photolithography during respectively different steps of a process for fabricating a microminiature integrated device. In such a process, an electron beam exposure system is advantageously employed to define some of the more critical features of the device. The other features are defined photolithographically.

For the electron lithographic step(s) of such a hybrid process, highly sensitive electron resists are available. By utilizing these resists, it is economical in some cases to expose even large areas of a resist-coated wafer with an electron beam system. But, in practice, such resists are typically characterized by (1) relatively poor resolution of developed patterns in thick films, (2) relatively poor tolerance to many dry etching processes of practical importance and (3) the disadvantage that the substitution of electron resists for photoresists in a photolithographic fabrication sequence requires modification of a number of the standard photolithographic processing steps other than the exposure step itself. For these reasons in particular, proposals to utilize an electron beam system to complement a photolithographic device fabrication process have not heretofore usually appeared attractive.

Moreover, in such a hybrid fabrication process, it appeared not to be feasible to expose a relatively insensitive photoresist (rather than a sensitive electron resist) with a high-speed electron beam system of the raster scanning type.

SUMMARY OF THE INVENTION

In accordance with a basic aspect of the principles of the present invention, applicants recognized that, by uniquely modifying the raster scanning mode of operation of an electron beam exposure system, it is practicable to directly define low-density features in a relatively insensitive positive photoresist that exhibits high resolution and good processing characteristics. As a result, it is feasible to utilize such an electron beam exposure system as an adjunct in what is otherwise a photolithographic fabrication process to define certain critical features of a microminiature device.

In particular, applicants' invention is a new method of operating a raster-scan-mode-of-operation electron beam lithographic system to irradiate a photoresist-coated workpiece that is supported on a continuously moving table. The method comprises the step of generating deflection signals that in effect exactly compensate for both table motion and the regular raster scan deflection signals of the system to cause the electron beam to dwell only on each of multiple selected portions of a low-density pattern for a time that is substantially greater than the time during which each portion would be exposed during regular raster scanning of the surface of the workpiece.

In one specific embodiment of applicants' invention, an electrostatic deflector is added to a conventional electron beam exposure system of the raster scanning type. During selected intervals of time, the beam is unblanked and the added deflector is controlled to exactly compensate for the raster scanning signals generated by the standard electromagnetic deflection unit of the exposure system. In that way, the electron beam is in effect held stationary with respect to each of selected portions of a photoresist-coated workpiece for a sufficiently long time to achieve a specified degree of chemical action to result in the desired pattern being formed upon subsequent development.

In another specific embodiment, the aforenoted electrostatic deflector is not included in the electron column of the exposure system. In that case, the raster scanning signals provided by the standard electromagnetic deflection unit are modified to provide a resultant set of signals that are equivalent to the composite signals achieved by generating both electromagnetic and compensating electrostatic deflection signals.

In some embodiments of the present invention, it is advantageous to provide a variable-spot-size capability for the electron exposure system. In that way, the sizes of the selected photoresist portions being irradiated can be selectively controlled. This may be achieved, for example, by providing in the electron column two spaced-apart apertures with a deflection unit therebetween. In such a system, it is feasible to rapidly deflect the image of the first electron-beam-illuminated aperture thereby to alter the portion of the second aperture that is illuminated by the beam. Subsequently, the beam propagated through the second aperture is demagnified to form a variable-size writing spot on the surface of a resist-coated workpiece.

Other ways of controlling the writing spot size are practicable. For example, the strength of one of the electromagnetic lenses included in the column may be controllably varied to form a larger or smaller image. In that case, another electromagnetic lens downstream of the varied one is correspondingly adjusted to form a focussed image of the variable-spot-size beam on the surface of the workpiece.

BRIEF DESCRIPTION OF THE DRAWING

A complete understanding of the present invention and of the above and other features thereof may be gained from a consideration of the following detailed description presented hereinbelow in connection with the accompanying drawing, in which.

DETAILED DESCRIPTION

Figure 1:
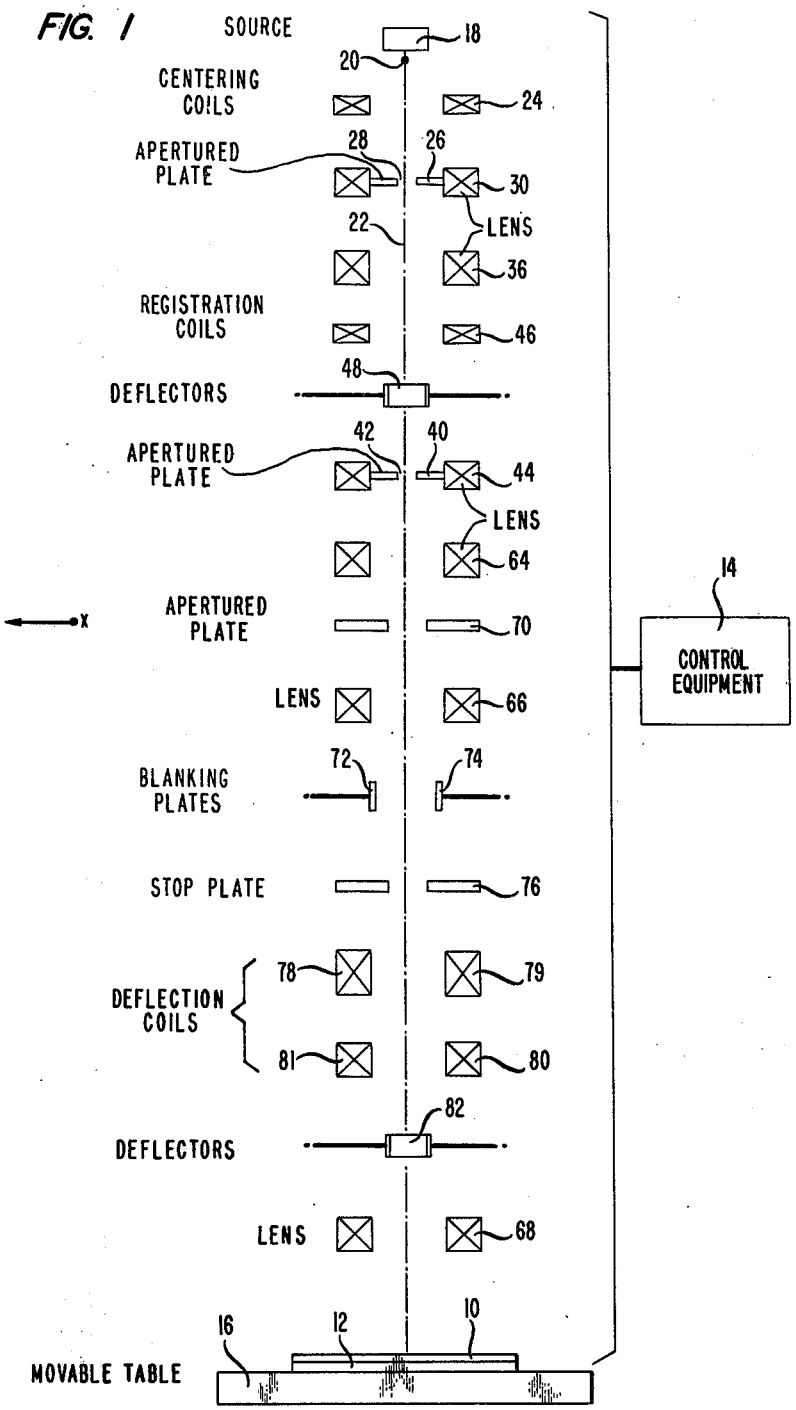
FIG. 1 is a diagrammatic representation of a specific illustrative electron beam exposure system made in accordance with the principles of the present invention.

FIG. 1 depicts a specific illustrative lithographic apparatus for controllably moving a variable-size electron spot to any designated position on the top surface of a photoresist layer 10 supported on a substrate 12. In turn, the substrate 12 is mounted on a conventional x-y-movable table 16.

The electron beam apparatus of FIG. 1 may be considered to comprise two main constituents. One is the column itself and the other is equipment 14 connected to the column for controlling the operation of various elements therein. The column is characterized by highly accurate high-speed deflection and blanking capabilities generally similar to those exhibited by the columns described in U.S. Pat. No. 3,801,792, issued Apr. 2, 1974 to L. H. Lin and in U.S. Pat. No. 3,900,737, issued Aug. 19, 1975 to R. J. Collier and D. R. Herriott. In addition, the particular column depicted in FIG. 1 is further characterized by a variable-spot-size scanning capability of the type described in a commonly assigned copending application of R. J. Collier and M. G. R. Thomson, Ser. No. 855,608, filed Nov. 29, 1977.

The other main constituent of the FIG. 1 apparatus comprises control equipment 14. Illustratively, the equipment 14 is of the general type described in the aforecited Collier-Herriott patent and in the Collier-Thomson application. The equipment 14 supplies electrical signals to the described column to systematically control deflecting, scanning and blanking of the electron beam. Moreover, the equipment 14 supplies control signals to the x-y table 16 to mechanically move the work surface 10 during the electron beam scanning operation, in a manner now well known in the art.

The specific illustrative electron column of FIG. 1 includes a conventional electron source 18. For example, the source 18 comprises a standard lanthanum hexaboride electron emitter. In the immediate downstream vicinity of the source 18, the trajectories of electrons emanating from the source 18 go through a so-called crossover or source image point 20 which, for example, is about 50 micrometers in diameter. Thereafter the electron paths successively diverge and converge as the electrons travel downstream along longitudinal axis 22 toward the work surface 10.

Illustratively, the electron column of FIG. 1 includes standard coils 24 by means of which the electron trajectories emanating from the crossover point 20 may be exactly centered with respect to the longitudinal axis 22. Thereafter the electron beam is directed at a mask plate 26 which contains a precisely formed aperture 28 therethrough. The beam is designed to uniformly illuminate the full extent of the opening or aperture 28 in the plate 26 and to appear on the immediate downstream side of the plate 26 with a cross-sectional area that corresponds exactly to the configuration of the aperture 28.

By way of example only, the mask plate 26 of FIG. 1 is shown mounted on and forming an integral unit with an electromagnetic field lens 30. Inclusion of the lens 30 in the FIG. 1 column is not always necessary. And, even when included, the lens 30 may if desired be separate and distinct from the plate 26. If included, the lens 30 is not usually designed to magnify or demagnify the cross-sectional configuration of the electron beam on the downstream side of the plate 26. But, in combination with a next subsequent downstream lens, to be described later below, the lens 30 serves to maximize the transmission of electrons along the depicted column and to selectively control the locations of successive crossover points on the axis 22.

The cross-sectional configuration of the electron beam that passes through the mask plate 26 of FIG. 1 is determined by the geometry of the aperture 28. In turn, this beam configuration propagates through a conventional electromagnetic lens 36 (for example, an annular coil with iron pole pieces) which forms an image of the aforedescribed aperture on a second mask plate 40. The plate 40 contains a precisely formed aperture 42 and, illustratively, is mounted on and forms an integral unit with electromagnetic field lens 44.

A predetermined quiescent registration of the image of the aperture in the mask plate 26 on the plate 40 of FIG. 1 is assured by, for example, including registration coils 46 in the depicted column.

The location of the image of the electron-beam-illuminated aperture 26 on the second mask plate 40 of FIG. 1 is selectively controlled in a high-speed way during the time in which the electron beam is being scanned over the work surface 10. This is done by means of deflectors 48 positioned, for example, as shown in FIG. 1 to move the beam in the x and/or y directions. Advantageously, the deflectors 48 comprise two pairs of orthogonally disposed electrostatic deflection plates. Electromagnetic deflection coils may be used in place of the electrostatic plates, but this usually leads to some loss in deflection speed and accuracy. Whether electrostatic or electromagnetic deflection is employed, the deflectors 48 may also be utilized to achieve registration of the image of the aperture in the plate 26 on the second mask plate 40. This is done by applying a steady-state centering signal to the deflectors 48. In that case the separate registration coils 46 may, of course, be omitted from the column.

The cross-sectional area of the electron beam transmitted through the apertured plate 40 of the electron column of FIG. 1 is subsequently demagnified. This is done by means of three conventional electromagnetic lenses 64, 66 and 68 positioned downstream of the plate 40. In one specific illustrative embodiment of the principles of the present invention, these lenses are designed to achieve an overall demagnification of the beam propagated therethrough by a factor of 400. More particularly, these lenses are selected to demagnify the aforementioned cross-sectional area of the beam transmitted by the mask plate 40 and to image a reduced counterpart thereof on the work surface 10. For an overall demagnification of 400, and for a specific illustrative case in which the cross section of the beam immediately downstream of the plate 42 measures 200-by-800 micrometers, the electron spot imaged on the surface 10 will quiescently be a rectangle 0.5 micrometers wide and 2.0 micrometers high.

The other elements included in the column of FIG. 1 are conventional in nature. Except for one deflector unit, these elements may, for example, be identical to the corresponding parts included in the columns described in the aforecited patents and application. These elements include a beam-limiting apertured plate 70, electrostatic beam blanking plates 72 and 74, an apertured blanking stop plate 76 and electromagnetic deflection coils 78 through 81.

If the beam blanking plates 72 and 74 of FIG. 1 are activated, the electron beam propagating along the axis 22 is deflected to impinge upon a nonapertured portion of the plate 76. In that way the electron beam is blocked during prescribed intervals of time from appearing at the surface 10. If the beam is not so blocked, it is selectively deflected by the coils 78 through 81 to appear at any desired position in a specified subarea of the work surface 10. Access to other subareas of the surface 10 is gained by mechanically moving the surface by means, for example, of a computer-controlled micromanipulator, as is known in the art.

In addition, the column of FIG. 1 includes deflectors 82. The purpose of these deflectors will be described later below.

The column shown in FIG. 1 is controlled by equipment 14 to operate in a so-called raster-scan-mode-of-operation. This mode, which is described in the aforecited Collier-Herriott patent and in the Collier-Thomson application, involves successively scanning the beam on the work surface 10 along parallel equally spaced-apart scan lines. Illustratively, each such scan line may be considered to comprise multiple equally spaced-apart address positions. At each address position during traversal of a scan line, the electron beam is blanked or not in the manner described above. Additionally, the area of the beam that impinges upon the work surface 10 at each address position is selectively controlled.

As the variable-size electron spot is deflected along a row of the scan field, the spot is intensity modulated by the beam blanking plates 72 and 74 at, for example, a 20 megahertz rate. This modulation rate corresponds with a single-address exposure time of 50 nanoseconds, which is compatible with the sensitivities of available sensitive electron resist materials.

The aforedescribed raster-scan-mode-of-operation constitutes an advantageous mode that in practice is the basis for high-precision high-speed operation of an electron beam exposure system. Systems embodying this advantageous mode are in use in industry for fabricating microminiature semiconductor devices and circuits.

As stated earlier above, it is known to utilize direct electron lithographic techniques in a hybrid device fabrication process to define some of the more critical features of the device, thereby to achieve, for example, increased packing density as well as improved speed and power characteristics. But, for the reasons stated earlier above, the use of sensitive electron resists for the electron lithographic step(s) of such a hybrid process often is not attractive. Moreover, it appeared not to be feasible to expose a relatively insensitive photoresist (rather than a sensitive electron resist) with a high-speed electron beam system of the aforedescribed raster scanning type.

In accordance with a basic aspect of the principles of the present invention, applicants recognized that, by modifying the raster scanning mode of operation of an electron beam exposure system, it is practicable to directly define low-density features in a relatively insensitive positive photoresist that exhibits high resolution and good processing characteristics. As a result, it is feasible to utilize such an electron beam exposure system as an adjunct in what is otherwise a photolithographic fabrication process to define certain critical features of a microminiature device.

In particular, applicants recognized that certain low-density patterns whose constituent elements are more or less uniformly distributed over each chip area of a wafer could be exposed in a relatively insensitive photoresist without reducing the overall speed of operation of a raster scanning electron beam exposure system. To do this, it was found necessary to alter the standard raster scanning format in a unique way, which will be described in detail later below.

More specifically, applicants have determined that a number of available photoresists can be satisfactorily exposed in currently available electron beam lithographic systems of the raster scanning type. Such a system of, for example, the Collier-Herriott type exhibits a beam current density of about 160 nanoamperes per square micrometer at an anode potential of 10 kilovolts. For such a current density, applicants recognized that the dwell time of the electron beam on each photoresist element to be exposed would have to be increased by about 20 to 100 times over the per-element exposure time achieved in standard raster scanning. In practice, this means that if the throughput of a standard raster scanning machine is not to be significantly reduced, only about 1 out of 20-to-100 standard address positions on the workpiece can be exposed. The area exposed, however, can be considerably higher than 1-to-5 percent of the total area because the standard beam diameter (say 0.5 micrometers) of the basic Collier-Herriott system can be expanded (for example to 2.0 micrometers) by utilizing a variable-spot-size column while maintaining approximately the same current density in the larger exposed element.

For purposes of a specific illustrative example herein, it will be assumed that a raster scanning electron beam machine is modified to irradiate a low-density set of regularly spaced-apart regions of a positive photoresist layer. In particular, it will be assumed that the regions to be irradiated are definitive of contact window openings in a microminiature device. Further, it will be assumed that each such opening is to be, for example, a square one micrometer on a side. (Square or rectangular spots are formed by the variable-spot-size column shown in FIG. 1.)

Figure 2:
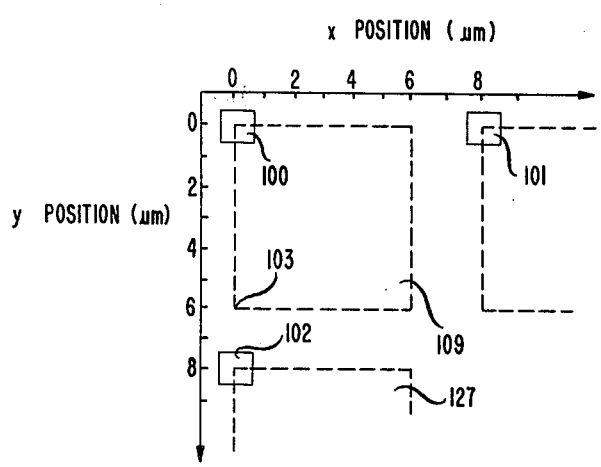
FIG. 2 is a simplified layout map of a portion of a photoresist-coated semiconductor wafer showing three contact window regions to be irradiated.

Three such square contact window openings 100 through 102 are represented in the layout map of FIG. 2. Because of layout rules prescribed for this particular map, there are no other openings with centers in the dashed-line 6-micrometer-on-a-side squares. Continuous movement of the table 16 (FIG. 1) occurs in the x direction indicated in FIG. 2. Scanning of the electron beam takes place in the y direction.

As described in the aforecited Collier-Herriott patent, correction signals are applied to the deflection coils 78 through 81 (FIG. 1) to compensate for motion of the table 16. In that way a skewed scan is avoided. The scanning beam is thereby controlled to write at successive locations along a y-parallel line.

In accordance with a basic aspect of applicants' invention, signals are also generated to exactly compensate for the regular raster scan deflection signals provided by the coils 78 through 81 of FIG. 1. In one particular embodiment, these compensating signals are provided by the electrostatic deflection unit 82. The particular manner in which this is done along one y scan is represented in FIG. 3.

Figure 3:
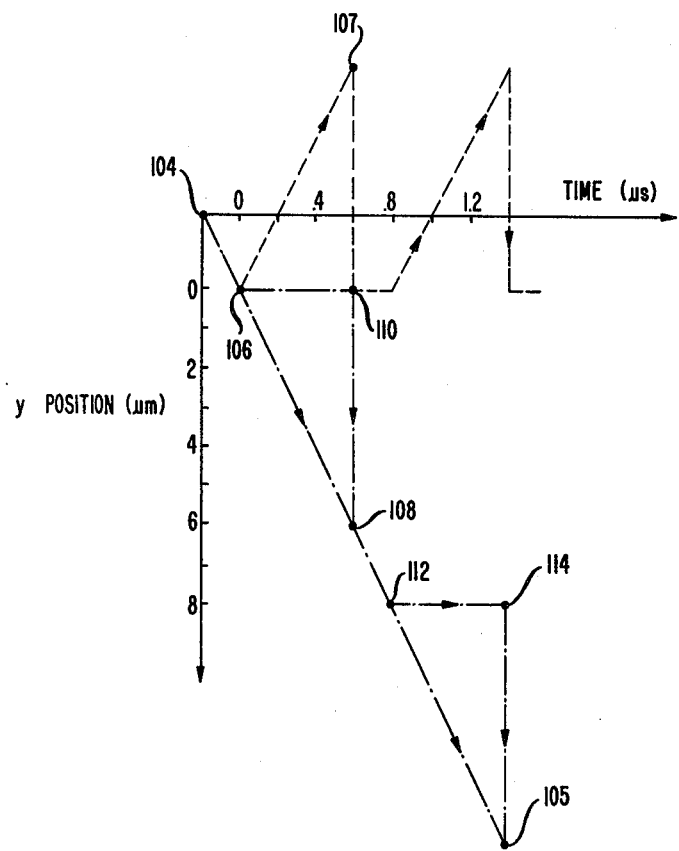
FIG. 3 shows the manner in which the regular y-direction raster scanning deflection signals are compensated for at those positions where irradiation of the photoresist layer is to occur.

In FIG. 3 the straight line that extends between points 104 and 105 indicates the deflection that would be imparted to the electron beam by the electromagnetic deflection coils 78 through 81 alone. Such deflection would cause one y-direction scan in the standard raster scanning format. (It is assumed that spaced-apart openings 100 and 102 are centered along this particular scan line.) In accordance with this invention, compensating deflection signals are provided by the unit 82 to cause the beam to in effect dwell at two regions along the depicted scan line. These regions constitute the openings 100 and 102. Significantly, the centers of the regions to be irradiated are not limited to the relatively coarse address structure normally employed in a standard raster scanning system to insure economical throughput.

The compensating signals generated by the deflection unit 82 of FIG. 1 are shown in FIG. 3 as dashed lines. The resultant of the compensating signal represented by the line between points 106 and 107 and the regular deflection signal represented by the line between points 106 and 108 is the line between points 106 and 110. This resulting signal maintains the temporarily unblanked beam stationary centered at y position No. 0 for approximately 0.6 microseconds, which is typically not sufficiently long to adequately expose available positive photoresist materials. During that period, a region corresponding to the contact window opening 100 (FIG. 2) is partially irradiated.

The electron beam is then blanked again while the resulting deflection signal follows the path from point 110 to point 108 to point 112. At point 112, the beam is unblanked again. The resulting deflection signal for the next 0.6 microseconds is represented by the line between points 112 and 114. During that interval the beam is in effect maintained stationary centered at y position No. 8 to partially expose a region corresponding to the contact window opening 102.

In the particular compensated manner specified above, it is apparent that the scanning beam is controlled to dwell on two defined photoresist regions for a period that is approximately twelve times longer than would be the case if the standard raster scanning mode were not modified. But, for the particular relatively insensitive high-resolution positive photoresists to be specified later below, this dwell period is still not long enough to insure adequate exposure of the photoresist material. (However, in some cases of practical interest wherein more sensitive materials are employed, such dwelling along a single y-scan line may be sufficient to provide adequate irradiation of one or more regions therealong. But emphasis herein will be directed to the case wherein still additional irradiation of the region(s) is required.)

Hence, in accordance with another aspect of the principles of the present invention, the standard raster scanning mode is further modified during subsequent y scans to enable additional irradiation of the partially exposed regions. The unique manner in which this is done is illustrated in FIG. 4.

Figure 4:
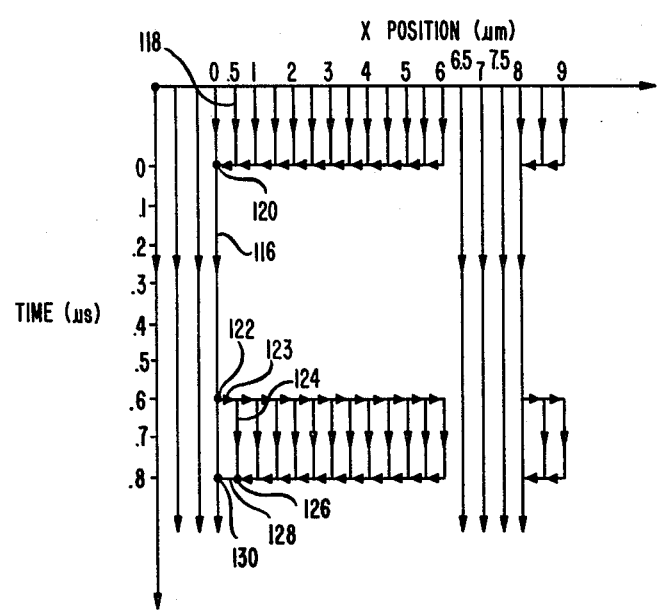
FIG. 4 illustrates the way in which the x deflections of the exposure system are controlled during successive y-direction scans.

In FIG. 4, y-direction scan line 116 occurring at x position 0 corresponds to the particular nonlinear y scan described above and depicted in FIG. 3. Ordinarily, the next or second y-direction scan line to be described would commence at x position 0.5 and extend parallel to the line 116. But, in accordance with another aspect of the principles of this invention, the path of this second scan line is selectively modified. As shown in FIG. 4, the second y-direction scan line commences at x position 0.5 and initially extends parallel to line 116 for the extent of path segment 118. Then, at a y position corresponding to the upper edge of the dashed-line square 109 (FIG. 2), an x-direction deflection signal is generated to cause the beam to move to a position centered about point 120 in the FIG. 4 depiction. This point represents the center of the opening 100. Illustratively, this x-direction deflection signal is supplied by the aforespecified deflection unit 82. (As noted above, the point 120 is not limited to being coincident with one of the points defining the relatively coarse address structure of a standard raster scanning system. High-accuracy placement of the point 120 and other center points is thereby possible.)

An x-direction deflection signal of the type described above is maintained for the entire interval during which the region 100 is to be irradiated. During this interval, the beam is unblanked and compensating deflection signals of the type described above in connection with FIG. 3 are also generated in the exposure system. As a result, the beam dwells on the region 100 for an additional 0.6 microseconds.

In accordance with one specific illustrative mode of operation encompassed within the principles of the present invention, the standard raster scanning mode is resumed whenever the beam extends outside one of the dashed-line squares represented in FIG. 2. Thus, as shown in FIG. 4, the scanning beam is subsequently blanked and moved rapidly from the position centered about the point 120 to point 122. The point 122 corresponds to the lower left-hand corner point 103 (FIG. 2) of the dashed-line square 109. At that point, the aforespecified compensating x-direction deflection signal is removed. In turn this causes the beam path to follow the line segments 123 and 124. It is apparent that the segment 124 represents a portion of the unmodified y scan in a standard raster scanning electron beam exposure system. Subsequently, at point 126, the upper edge of the lower left-hand dashed-line square 127 is encountered. In response thereto, the scanning system is controlled to generate another compensating x-direction deflection signal, which causes the beam to traverse line segment 128. At point 130, which corresponds to the center of region 102 (FIG. 2), the beam is again unblanked and, while the compensating x-direction deflection signal is maintained constant, compensating y-direction signals of the type shown in FIG. 3 are generated. As a result, the irradiating electron beam is controlled to dwell again on the region 102.

Subsequent y scans starting from successive spaced-apart x positions are represented in FIG. 4. For such scans that fall within one of the dashed-line squares of FIG. 2, the magnitudes of the compensating x-direction deflection signals must be progressively increased, as is apparent from the FIG. 4 depiction. In that manner, by also unblanking the beam and generating compensating y-direction deflection signals in the manner described above, further irradiation of the regions 100 through 103 takes place. In accordance with the specific illustrative depiction of FIG. 4, it is evident that each of the regions 100 and 102, for example, is successively irradiated during each of thirteen 0.6-microsecond-long separate dwell intervals. The cumulative effect of these exposures is to achieve substantially complete exposure of the positive photoresist material in the regions definitive of the aforespecified contact window openings.

From FIG. 4, it is seen that normal raster scanning occurs at x positions 6.5, 7, and 7.5. These scans occur in the space between the upper two dashed-line squares of FIG. 2. Of course, if three further dwell intervals were needed to additionally irradiate the regions 100 and 102, even these standard scans could be modified in the way specified above to achieve additional exposure of the photoresist.

Although emphasis hereinabove has been directed to a variable-spot-size electron column having a separate compensating deflection unit 82, it is advantageous in some cases of practical interest to modify the column in various ways that fall within the scope of the principles of the present invention. For example, an electron beam exposure system of the type described in the Collier-Herriott patent includes a high-speed high-performance set of electromagnetic deflection coils corresponding to the coils 78 through 81 shown in FIG. 1. In such a system, it is feasible to omit the electrostatic deflection unit 82 and instead to apply composite signals to the coils 78 through 81. In turn, the composite signals generate beam-deflecting signals. These composite signals are in effect the resultant of the above-described table-motion-correcting signals, compensating y-direction signals and compensating x-direction signals.

Moreover, the aforementioned variable-spot-size capability may be achieved in alternative ways. Thus, for example, the apertured mask plates 26 and 40 and the deflection unit 48 may be removed from the particular illustrative column represented in FIG. 1. In that case, a variable-spot-size round beam can be realized by selectively decreasing or increasing the strength of, for example, electromagnetic lens 36 and, correspondingly, refocussing lenses 64, 66 and 68 to respectively form a smaller or larger focussed image on the surface of the photoresist layer 10. For simple round features, each variable-size image will be characterized by substantially the same current density. (If it is desired to vary the size of a rectangular rather than a round beam, a single beam-defining apertured plate may be included in the FIG. 1 column.)

A number of high-resolution photoresists suitable for inclusion in the herein-described electron beam exposure process are known. One such suitable material is poly(styrene-sulfone) which is a copolymer of sulfur dioxide and styrene. This material exhibits a sensitivity of $4$-to-$8 \times 10^{-5}$ coulombs per square centimeter at 10 kilovolts, is resistant to dry etching processes such as plasma etching and is capable of one-micrometer resolution. This material is described in *Journal of the Electrochemical Society*, Volume 122, No. 10, page 1370, October 1975.

Other suitable positive photoresists for use in the herein-described process include Shipley AZ-1350J (commercially available from Shipley Co. Inc., Newton, Mass.), Hunt HPR-104 (commercially available from Philip A. Hunt Chemical Corp., Palisades Park, N.J.) and GAF PR-102 (commercially available from GAF Corp., Binghampton, N.Y.). Counterparts of the aforespecified Shipley and Hunt formulations are described in U.S. Pat. No. 3,201,239, and a counterpart of the aforespecified GAF formulation is described in U.S. Pat. No. 3,637,384. These and other known photoresist materials make it feasible to operate a raster scanning electron beam exposure system in the unique manner described herein without substantially affecting the overall speed of operation of the system.

Finally, it is to be understood that the above-described arrangements and procedures are only illustrative of the principles of the present invention. In accordance with those principles, numerous modifications and alternatives may be devised by those skilled in the art without departing from the spirit and scope of the invention. Thus, for example, although emphasis hereinabove has been primarily directed to exposing a resist as a basic step in the process of producing a pattern, it is apparent that the principles of the present invention are also applicable to modifying other types of raster scanning electron beam machines such as those adapted, for example, for micromachining applications or for altering the properties of a semiconductor memory. The dwelling strategy described herein is also applicable to these other types of machines to provide new and advantageous operating modes thereof even if a resist layer is not involved.

In addition, in some cases of practical importance applicants have determined that it is advantageous to employ both photo-beam and electron beam techniques in the same resist layer. Thus, for a pattern requiring a combination of small critical features and relatively large less critical features, the small features can be exposed by electron beam lithographic steps of the type specified above and the large features can be exposed by standard photolithographic steps. In subsequent steps, the entire layer, including both photo-beam-defined and electron-beam-defined features, is processed as an entity.

We claim:

1. A method of operating a raster-scan-mode-of-operation electron beam lithographic system to irradiate a workpiece (10, 12) that is supported on a continuously moving table (16), said method being CHARACTERIZED BY the step of
generating deflection signals that in effect exactly compensate for both table motion and the regular raster scan deflection signals of said system to cause the electron beam of dwell only on each of multiple selected portions of a low-density pattern for a time that is substantially greater than the time during which each portion would be exposed during regular raster scanning of the surface of the workpiece.

2. A method of operating a raster-scan-mode electron beam lithographic system to expose specified regions of a resist-coated workpiece supported on a table that during exposure moves continuously in the x direction, which resist is characterized by a low sensitivity that is incompatible with the relatively short single-address-exposure time of the raster scanning mode, said method comprising the steps of
unblanking the beam at preselected points along a particular y-direction scan line, said points defining the centers of said regions to be exposed,
generating compensating y-direction deflection signals and table-motion-compensating deflection signals to cause the beam to dwell on said specified regions centered about said points for a time period that is long relative to the time that the beam would expose said regions during normal raster scanning.

3. A method as in claim 2 further comprising the step of
also generating compensating x-direction deflection signals during subsequent y-direction scan intervals to cause the beam to dwell on said specified regions along said particular y-direction scan line during periods of said subsequent intervals.

4. A method as in claim 3 wherein the step of generating compensating x-direction deflection signals further comprises the step of
maintaining the magnitude of said compensating x-direction signal constant during a prescribed period of each different one of said subsequent y-direction scan intervals but progressively increasing said magnitude for respective successive ones of said intervals.

5. A method as in claim 4 wherein said resist coating constitutes a positive photoresist material characterized by high-resolution and ease of processing.

* * * * *